(12) United States Patent
Hirato et al.

(10) Patent No.: US 8,441,013 B2
(45) Date of Patent: May 14, 2013

(54) TFT SUBSTRATE INCLUDING DIVIDED DISPLAY SCREENS AND/OR SEPARATED DATA LINES, DISPLAY PANEL INCLUDING THE TFT SUBSTRATE, AND METHOD FOR MANUFACTURING THE TFT SUBSTRATE

(75) Inventors: Shinichi Hirato, Nara (JP); Mototsugu Ueshima, Kobe (JP); Masaki Maeda, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 179 days.

(21) Appl. No.: 12/296,320

(22) PCT Filed: Mar. 16, 2007

(86) PCT No.: PCT/JP2007/055392
§ 371 (c)(1),
(2), (4) Date: Oct. 7, 2008

(87) PCT Pub. No.: WO2008/001517
PCT Pub. Date: Jan. 3, 2008

(65) Prior Publication Data
US 2009/0159889 A1 Jun. 25, 2009

(30) Foreign Application Priority Data
Jun. 30, 2006 (JP) .................. 2006-182720

(51) Int. Cl.
*H01L 33/00* (2010.01)
*H01L 21/02* (2006.01)

(52) U.S. Cl.
USPC ............................. 257/59; 438/22

(58) Field of Classification Search ................. 257/59
See application file for complete search history.

(56) References Cited

U.S. PATENT DOCUMENTS

| 5,517,342 | A | 5/1996 | Kim et al. |
| 6,094,243 | A | 7/2000 | Yasunishi |
| 2003/0080932 | A1 | 5/2003 | Konno et al. |
| 2003/0214496 | A1 * | 11/2003 | Ishii et al. ................... 345/204 |
| 2006/0017139 | A1 | 1/2006 | Eguchi et al. |
| 2006/0050192 | A1 | 3/2006 | Cho et al. |
| 2010/0225831 | A1 | 9/2010 | Takeuchi et al. |

FOREIGN PATENT DOCUMENTS

| JP | 5-119332 | 5/1993 |
| JP | 06-301059 | 10/1994 |
| JP | 10-261804 | 9/1998 |
| JP | 10-268261 | 10/1998 |
| JP | 2000-292803 | 10/2000 |
| JP | 2003-330389 | 11/2003 |
| JP | 2007/102382 | 9/2007 |

OTHER PUBLICATIONS

International Search Report for PCT/JP2007/055392, mailed Apr. 24, 2007.
CN 1725500A dated Jan. 25, 2006 corresponds to US 2006/0017139 listed above.

* cited by examiner

*Primary Examiner* — Ha Tran T Nguyen
*Assistant Examiner* — Raj R Gupta
(74) *Attorney, Agent, or Firm* — Nixon & Vanderhye P.C.

(57) ABSTRACT

The present invention provides a method of manufacturing a TFT substrate, in which method a data signal line is separated into upper and lower regions at a separating point(Q) that is not around above a scan signal line but in a region where an i-layer and an $n^+$ layer formed on a gate insulating film are removed away in a flattened region of a gate insulating film.

7 Claims, 7 Drawing Sheets

TFT SUBSTRATE INCLUDING DIVIDED DISPLAY SCREENS AND/OR SEPARATED DATA LINES, DISPLAY PANEL INCLUDING THE TFT SUBSTRATE, AND METHOD FOR MANUFACTURING THE TFT SUBSTRATE

This application is the U.S. national phase of International Application No. PCT/JP2007/055392, filed 16 Mar. 2007, which designated the U.S. and claims priority to Japan Application No. 2006-182720, filed 30 Jun. 2006, the entire contents of each of which are hereby incorporated by reference.

TECHNICAL FIELD

The present invention relates to an arrangement of a TFT substrate in which a display panel is divided into an upper region and a lower region so that the upper and lower regions are driven and displayed.

BACKGROUND ART

There has arisen a problem that it takes a shorter time to write to each data signal line and each pixel, as a liquid crystal display device becomes more high-definition. For this reason, a method has been proposed in which a liquid crystal display panel is divided into an upper region and a lower region, and the upper and lower regions are driven by scan signal line drive circuits and data signal line drive circuits, respectively.

Figure 4:
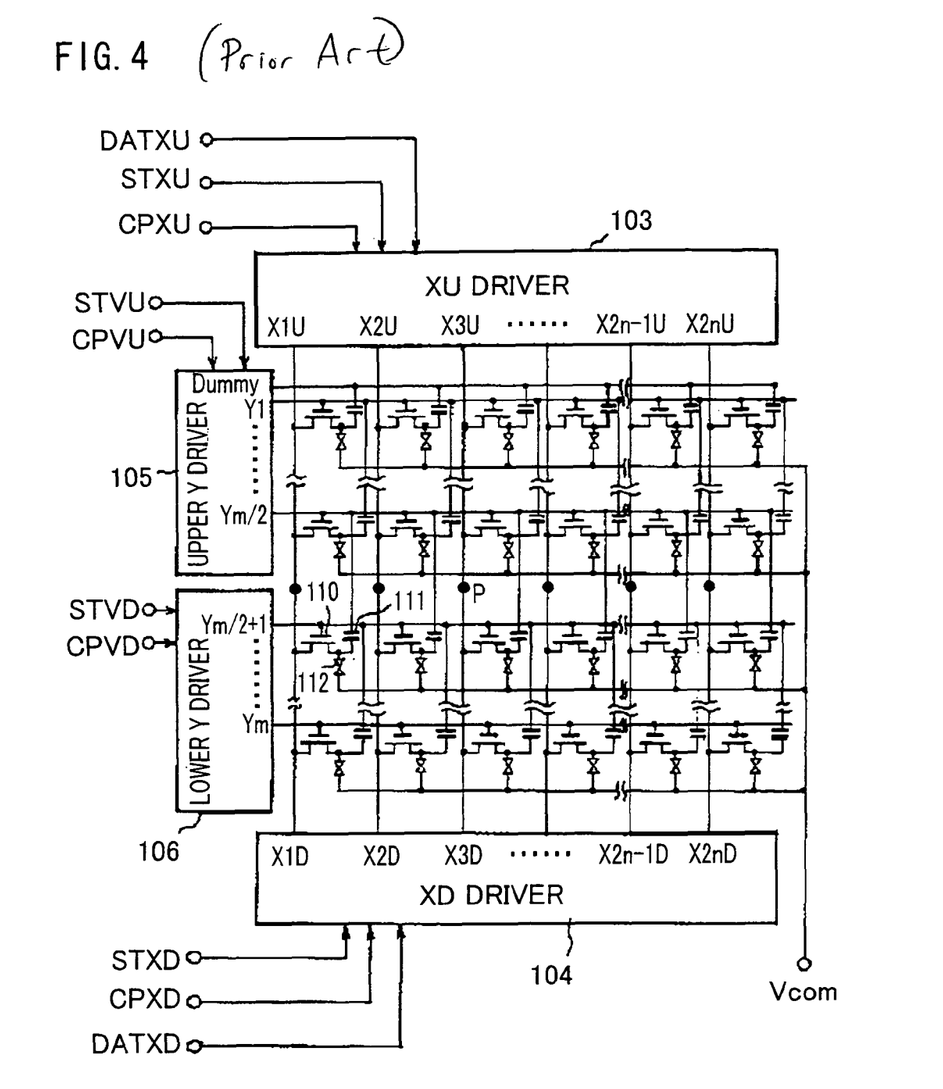
FIG. 4 is a block diagram showing a conventional technique, and illustrating an arrangement of a liquid crystal display device.

FIG. 4 illustrates an arrangement of a liquid crystal display device including such a liquid crystal display panel with divided upper and lower regions (see Patent Document 1, for example).

In FIG. 4, scan signal lines Y1 through Ym/2 of the upper half region of the display screen and a Dummy line are driven by an upper Y driver 105, and scan signal lines Ym/2+1 through Ym of the lower half region are driven by a lower Y driver 106. The upper Y driver 105 is provided with a clock signal CPVU and a start signal STVU, both of which are only for the upper Y driver, and the lower Y driver 106 is provided with a clock signal CPVD and a start signal STVD, both of which are only for the lower Y driver.

Data signal lines X1 through X2n are provided so as to intersect with the scan signal lines Y1 through Ym. The data signal lines are also separated into upper data signal lines X1U through X2nU, and lower data signal lines X1D through X2nD. The upper data signal lines are driven by an upper X driver 103, and the lower data signal lines are driven by a lower X driver 104. The upper X driver 103 is provided with upper image data DATXU, a clock signal CPXU, and a start signal STXU. The lower X driver 104 is provided with lower image data DATXD, a clock signal CPXD, and a start signal STXD.

At intersections of the scan signal lines Y1 through Ym/2 and the upper data signal lines X1U through X2nU, and of the scan signal lines Ym/2+1 through Ym and the lower data signal lines X1D through X2nD, TFTs 110 are provided, respectively, so that pixels are formed. When a scan signal line turns on a TFT 110, the TFT 110 connects a data signal line to a pixel electrode 112. This causes a voltage to be applied to a liquid crystal layer in accordance with display data. Further, each of the pixels includes a storage capacitor 111 formed with respect to the scan signal line, the scan signal line being adjacent to the pixel in an upper direction of the display screen.

Such an arrangement for driving a display panel that is divided into upper and lower regions is also disclosed in Patent Documents 2 and 3.

In a case of the display panel in which the divided upper and lower regions are driven independently, the data signal lines are separated into upper and lower data signal lines at a central part of the display panel in a step in which the TFT substrate is processed. A separating point where the data signal line is separated is usually around a region where the upper and lower regions are adjacent to each other, the region being around above the scan signal line or around above a storage capacitor line. For example, in FIG. 4, such a point is located around above the scan signal line Ym/2 or, as indicated by P, around above the scan signal line Ym/2+1.

The following description deals with a cross-sectional structure of the separating point P of the data signal line.

Figure 5:
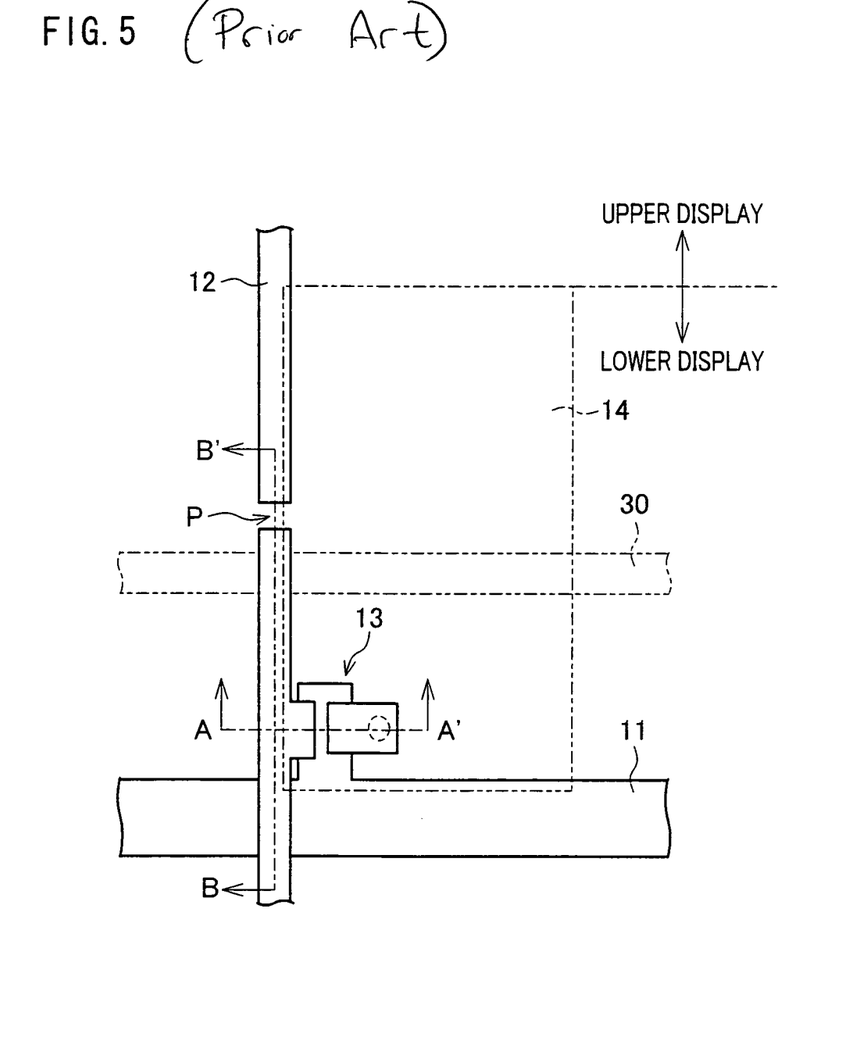
FIG. 5 is a plan view illustrating an arrangement in the vicinity of the separating point of the data signal line of the liquid crystal display device of FIG. 4.

FIG. 5 is a plan view illustrating the vicinity of the separating point P. For convenience of explanation, the scan signal line is indicated by a reference numeral 11, and the data signal line is indicated by a reference numeral 12. A TFT 13 is provided at an intersection of a scan signal line 11 and a data signal line 12. The data signal line 12 is connected with a pixel electrode 14 via the TFT 13. In FIG. 5, the region above the pixel electrode 14 corresponds to the upper display screen, and the region below the pixel electrode 14 corresponds to the lower display screen. The separating point P of the data signal line 12 is provided so as to be closer to the upper display screen than a connection point between the data signal line 12 and a source electrode of the TFT 13. Further, in a case where a storage capacitor of the pixel is connected with a storage capacitor line, a storage capacitor line 30 is provided parallel to the scan signal line 11, as illustrated in a dashed two-doted line of FIG. 5.

Figure 6:
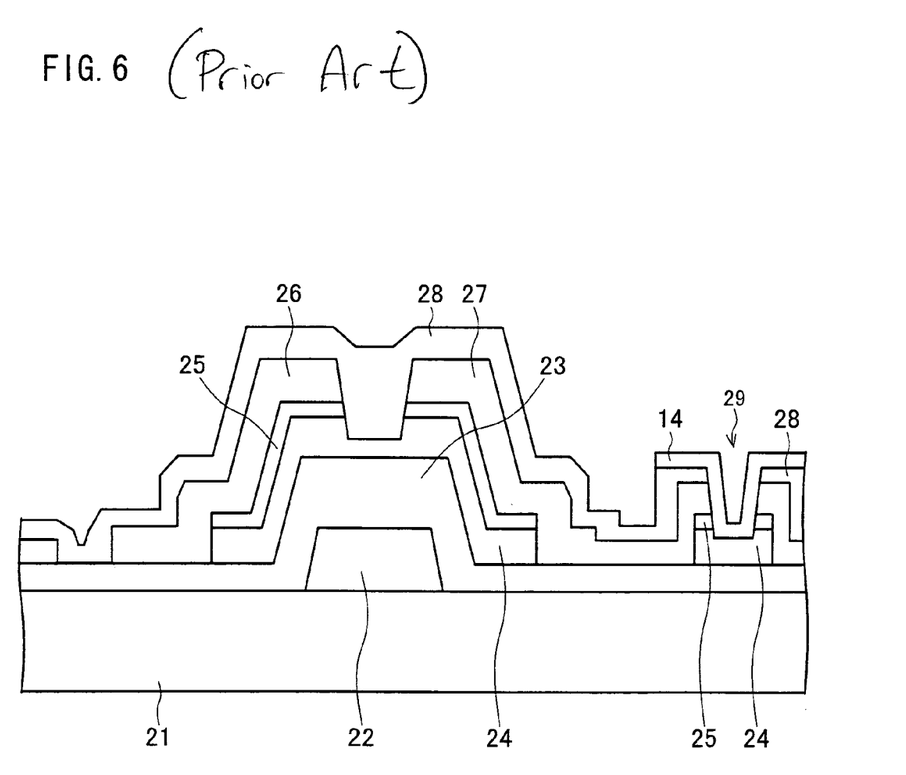
FIG. 6 is a cross-sectional view illustrating a structure of a TFT.

FIG. 6 illustrates a cross-sectional structure of the TFT 13.

The TFT 13 has a general arrangement in which, on a glass substrate 21, a gate electrode 22, a gate insulating film 23, an i-layer (an intrinsic semiconductor layer) 24 of amorphous silicon (a semiconductor), an $n^+$ layer 25 of microcrystal silicon (a semiconductor), a source electrode 26, a drain electrode 27, and a passivation film 28 are stacked in this order. The i-layer 24 is formed as a channel region, and the $n^+$ layer 25 is formed as source and drain regions, and also as a contact layer for the source and drain electrodes. Further, the passivation film 28 includes, in a region adjacent to the TFT 13, a contact hole 29 via which the drain electrode 27 is connected with the pixel electrode 14.

The data signal line 12 is formed simultaneously with the manufacturing of the TFT 13 in a step of manufacturing the TFT substrate. This forming step is explained below with reference to process steps illustrated in FIG. 7

Figure 7:
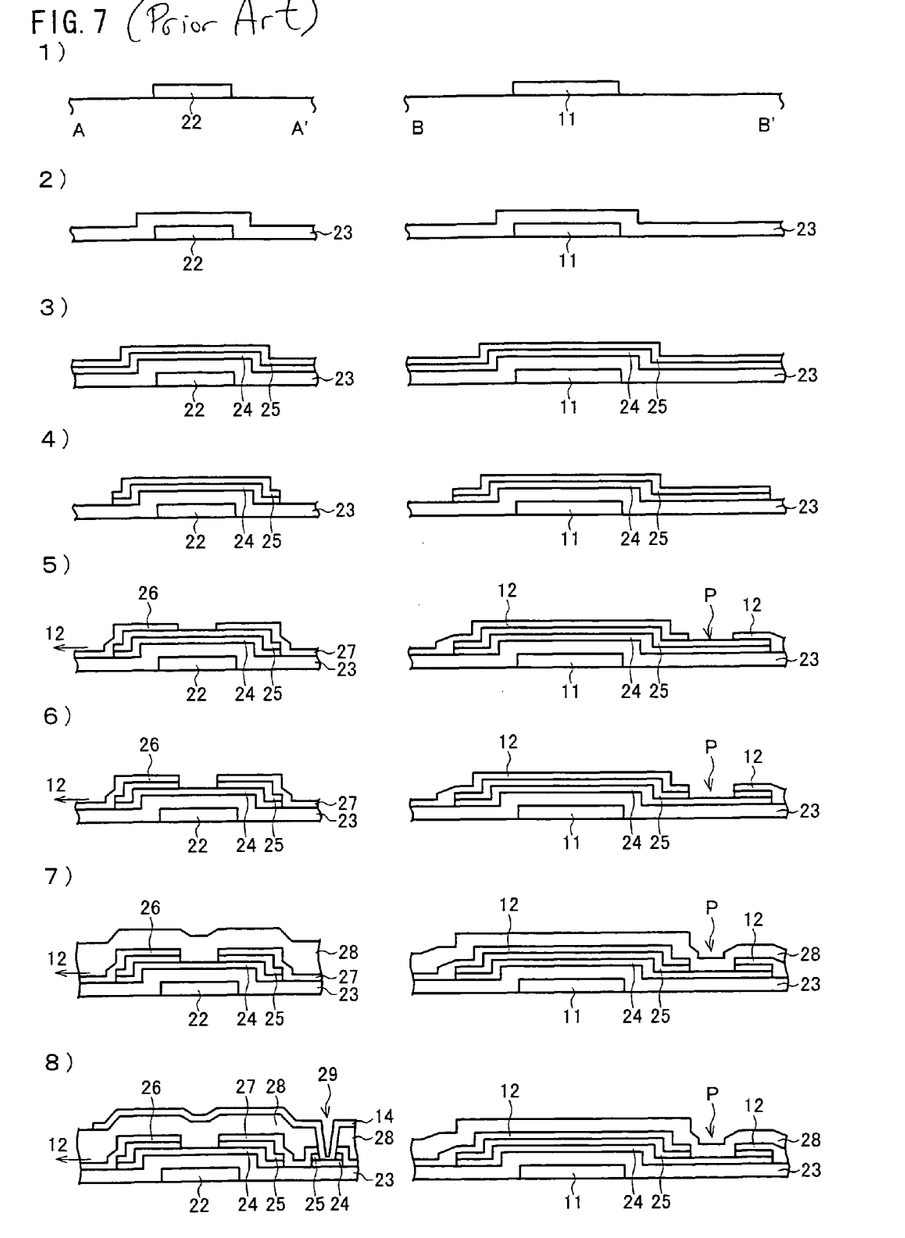
FIG. 7 is a cross-sectional view showing a conventional technique, and illustrating process steps related to formation of a separating point of a data signal line of a TFT substrate.

On the left side in FIG. 7, cross-sectional views taken along the line A-A' of FIG. 5, that is, cross-sectional views of the TFT 13, are illustrated. On the right side in FIG. 7, cross-sectional views (taken along the line B-B' of FIG. 5) of a region where the data signal line 12 is to be formed are illustrated.

In step 1, the gate electrode 22 of the TFT 13, and the scan signal line 11 are formed on the glass substrate 21. In step 2, the gate insulating film 23 is formed on the gate electrode 22 and the scan signal line 11. In step 3, the i-layer 24 and the $n^+$ layer 25 are formed, in this order, on the gate insulating film 23. In step 4, by a photolithography process, the i-layer 24 and the $n^+$ layer 25 are patterned (i) in a region where the TFT 13 should be provided, and (ii) in a predetermined region including a region above the scan signal line 11 in order to even a step in the vicinity of the scan signal line 11.

In step 5, the source electrode 26 and the drain electrode 27 of the TFT 13 are patterned. At this point, simultaneously with the forming of the source electrode 26, the data signal line 12 is formed adjacent to the source electrode 26. Further, of the data signal line 12, a point that is to be the separating point P for separating the data signal line 12 into the upper display screen side and the lower display screen side is arranged not to be stacked with a material of the data signal line 12. The point to be the separating point P is located on the i-layer 24 and the n+ layer 25 in the vicinity of and above the scan signal line 11, the point to be the separating point P being a relatively flat area where the i-layer 24 and the n+ layer 25 are not located directly above the scan signal line 11.

In step 6, the n+ layer 25 in the separating region, where the source electrode 26 and the drain electrode 27 are separated from each other in the TFT 13, is etched and removed. Further, the n+ layer 25 at the point to be the separating point P of the data signal line 12 is etched and removed. This causes the upper display screen side and the lower display screen side of the data signal line 12 to be electrically isolated at the separating point P. In step 7, the passivation film 28 is formed so as to cover the whole TFT 13 and the data signal line 12. Furthermore, in step 8, a transparent electrode ITO that is to function as the pixel electrode 14 is formed on the passivation film 28 of the TFT 13, and is connected with the drain electrode 27 via the contact hole 29 that is formed in advance by the photolithography process.

Note that as an alignment reference for the separating point P, the storage capacitor line 30 (see in FIG. 5) can be used instead of the scan signal line 11 (see FIGS. 5 and 7).

(Patent Document 1)
Japanese Unexamined Patent Publication No. 268261/1998 (Tokukaihei 10-268261, publication date: Oct. 9, 1998)
(Patent Document 2)
Japanese Unexamined Patent Publication No. 131635/2003 (Tokukai 2003-131635, publication date: May 9, 2003)
(Patent Document 3)
Japanese Unexamined Patent Publication No. 319342/1997 (Tokukaihei 9-319342, publication date: Dec. 12, 1997)

DISCLOSURE OF INVENTION

However, according to the conventional method for forming the separating point P, the semiconductive i-layer remains at the separating point P. This arises a problem that the i-layer is broken down, in the step of manufacturing the TFT substrate 13, due to a so-called ESD (Electro-static-discharge). The ESD is generated because static electricity charged in the manufacturing step can discharge between the upper and the lower data signal lines 12 via the i-layer, after the data signal line 12 is separated into the upper and lower data signal lines at the separating point P during the step of manufacturing the TFT substrate 13. Such discharge generated at the separating point P is caused by generation of an electric potential difference of approximately 300 mV or more between the upper and lower data signal lines 12, for example.

The present invention is made in view of the problem. An object of the present invention is to provide: a TFT substrate in which the ESD hardly occurs at a separating point; a display panel including the TFT substrate; a display device including the TFT substrate; and a method for manufacturing the TFT substrate.

In order to attain the object, the present invention provides a TFT substrate, on which TFTs, scan signal lines, and data signal lines are formed, for use in a display panel in which (i) a display screen is divided into a plurality of display screens so that the divided display screens are arrayed in a direction of the data signal line and (ii) the display screens thus divided are driven by scan signal line drive circuits and data signal line drive circuits, respectively, wherein: each of the data signal lines is separated, in a region where neither an intrinsic semiconductor layer as a semiconductor layer used in formation of a channel region of the TFT nor a layer formed on the intrinsic semiconductor layer and used as source and drain regions of the TFT is formed, so as to be separated between adjacent ones of the divided display screens into which the display screen is divided along the data signal lines.

According to the present invention, each of the data signal lines is separated, at a point where neither an intrinsic semiconductor layer as a semiconductor layer used in formation of a channel region of the TFT nor a layer formed on the intrinsic semiconductor layer and used as source and drain regions of the TFT is stacked, so as to be separated between adjacent ones of the divided display screens into which the display screen is divided along the data signal lines. Therefore, even when static electricity is charged on the data signal line, the intrinsic semiconductor layer cannot be broken, during the step of manufacturing the TFT substrate, due to the discharge between the data signal lines separated between adjacent ones of the divided display screens.

As described above, the present invention realizes the TFT substrate in which the ESD hardly occurs at the separating point of the data signal line.

Additional objects, features, and strengths of the present invention will be made clear by the description below. Further, the advantages of the present invention will be evident from the following explanation in reference to the drawings.

EXPLANATION OF LETTERS OR NUMERALS

11. SCAN SIGNAL LINE
12. DATA SIGNAL LINE
13. TFT
24. i-layer
25. n+ LAYER (USED AS SOURCE AND DRAIN REGIONS)
Q. SEPARATING POINT

BEST MODE FOR CARRYING OUT THE INVENTION

One embodiment of the present invention is described below with reference to FIGS. 1 through 3.

Figure 3:
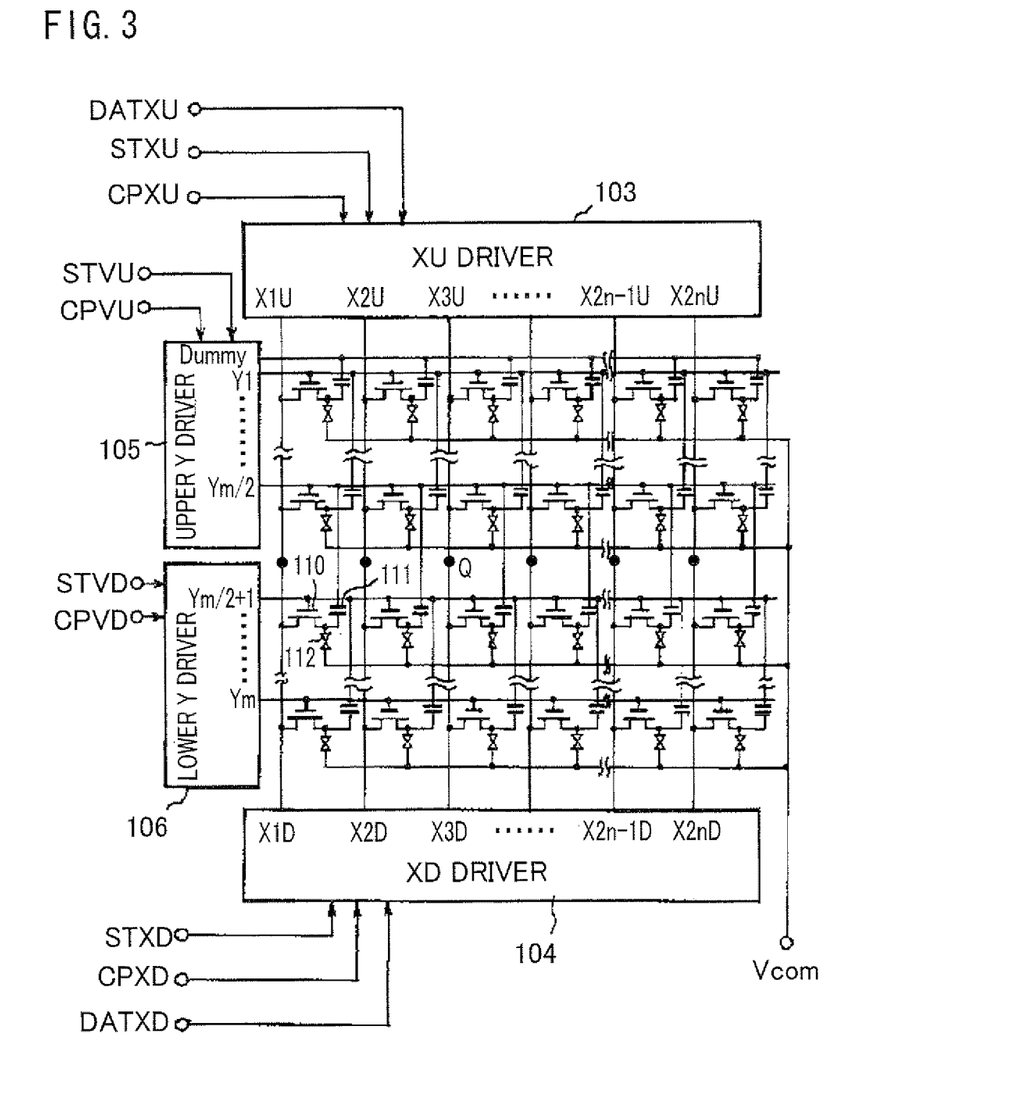
FIG. 3 is a block diagram illustrating an arrangement of a liquid crystal display device in accordance with an embodiment of the present invention.

FIG. 3 illustrates an arrangement of a display device of the present embodiment. The display device can have the same arrangement as a conventional display device, except an arrangement of a separating point Q of a data signal line. As an example, FIG. 3 illustrates a case where the display device of FIG. 4 (Patent Document 1) includes the separating point Q in place of the separating point P. As such, the following description deals with the separating point Q, and descriptions of the other arrangements are omitted.

Figure 2:
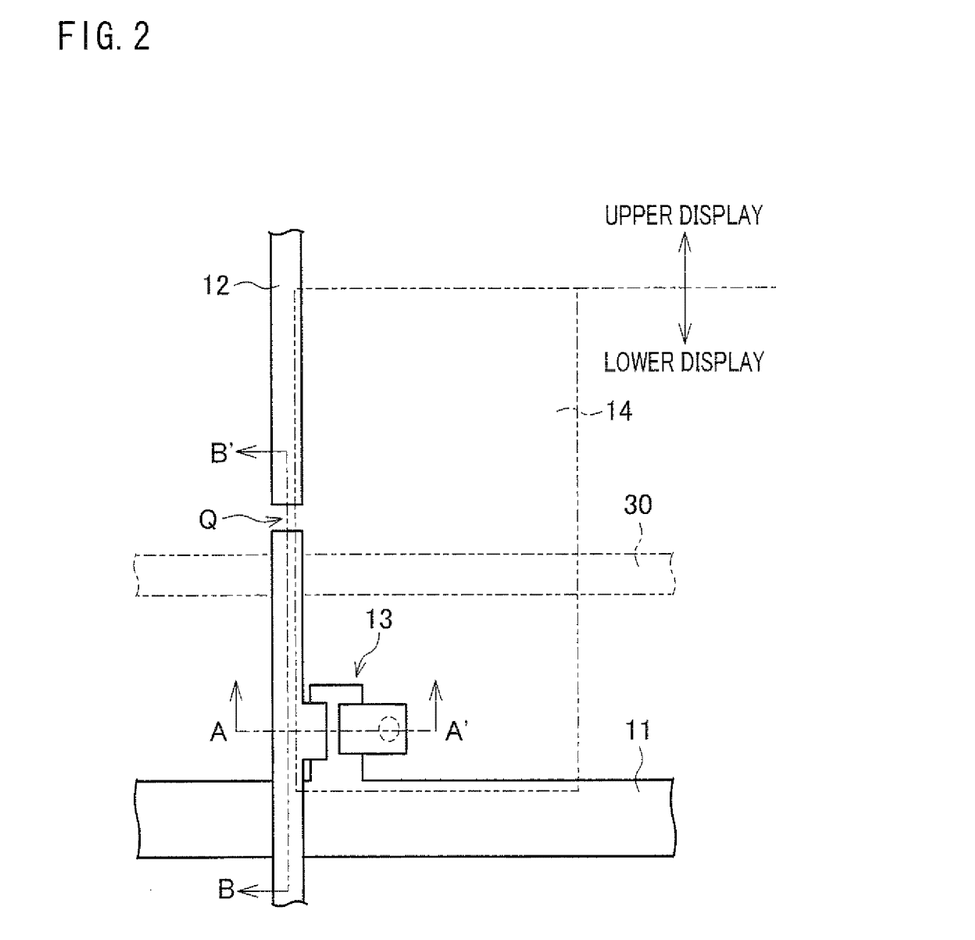
FIG. 2 is a plan view illustrating an arrangement in the vicinity of the separating point of the data signal line.

FIG. 2 is a plan view illustrating the vicinity of the separating point Q. FIG. 2 is the same as FIG. 5 in that a TFT 13 is provided at an intersection of a scan signal line 11 and a data signal line 12, and that the data signal line 12 is connected with a pixel electrode 14 via the TFT 13. In FIG. 2, the region above the pixel electrode 14 corresponds to an upper display screen, and the region below the pixel electrode 14 corresponds to a lower display screen. The separating point Q of the data signal line 12 is provided so as to be closer to the upper display screen than a connection point between the data signal line 12 and a source electrode of the TFT 13, and is formed in almost the same position as the conventional separating point P, as in the following example. Note however that, as will be described later, it is possible for the separating point to be formed in a different position from the separating point P of FIG. 5.

The data signal line 12 is formed simultaneously with the manufacturing of the TFT 13 in a step of manufacturing the TFT substrate. This forming step is explained below with reference to process steps illustrated in FIG. 1.

Figure 1:
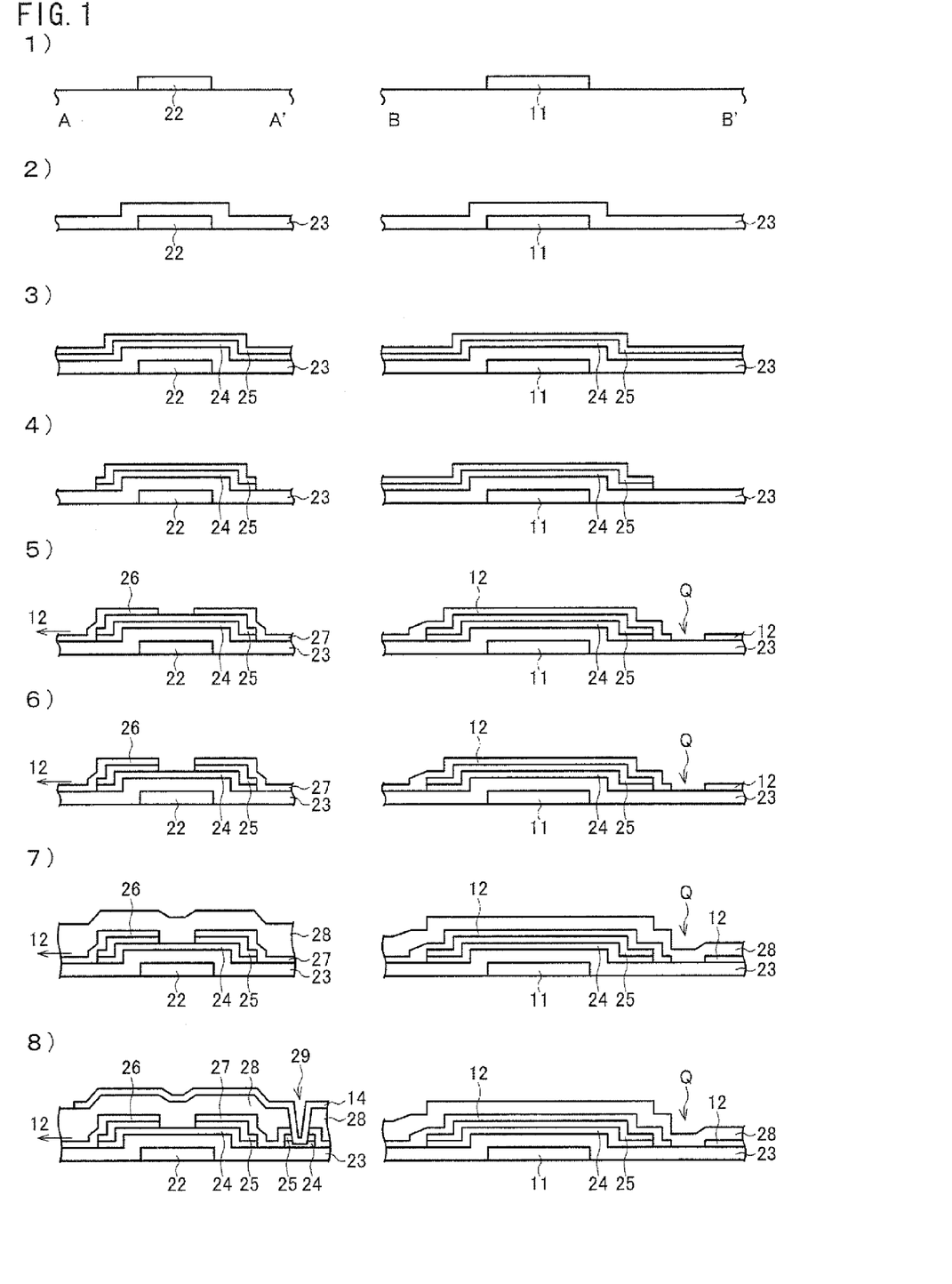
FIG. 1 is a cross-sectional view illustrating process steps related to formation of a separating point of a data signal line of a TFT substrate.

On the left side in FIG. 1, cross-sectional views taken along the line A-A' of FIG. 2, that is, cross-sectional views of the TFT 13, are illustrated. On the right side in FIG. 2, cross-sectional views (taken along the line B-B' of FIG. 2) of a region where the data signal line 12 is to be formed are illustrated.

In step 1, the gate electrode 22 of the TFT 13, and the scan signal line 11 are formed on the glass substrate 21. In step 2, the gate insulating film 23 is formed on the gate electrode 22 and the scan signal line 11. In step 3, the i-layer 24 and the n$^+$ layer 25 are formed, in this order, on the gate insulating film 23. In step 4, by a photolithography process, the i-layer 24 and the n$^+$ layer 25 are patterned (i) in a region where the TFT 13 should be provided, and (ii) in a predetermined region including a region above the scan signal line 11 in order to even a step in the vicinity of the scan signal line 11.

Here, the i-layer 24 and the n$^+$ layer 25 are left in regions directly above the scan signal line 11, and in a region on a B side with respect to the scan signal line 11, as in FIG. 5. As to a region on a B' side with respect to the scan signal line 11, the i-layer 24 and the n$^+$ layer 25 in a flattened region where the step is sufficiently evened is etched and removed up to an end of the i-layer 24 and the n$^+$ layer 25 on the B' side.

In step 5, the source electrode 26 and the drain electrode 27 of the TFT 13 are patterned. At this point, simultaneously with the forming of the source electrode 26, the data signal line 12 is formed adjacent to the source electrode 26. Further, of the data signal line 12, a point that is to be the separating point Q for separating the data signal line 12 into the upper display screen side and the lower display screen side is arranged not to be stacked with a material of the data signal line 12. The point to become the separating point Q is a point which is obtained by etching and removing a flat region of the i-layer 24 and the n$^+$ layer 25, in which flat region the separating point P is formed in FIG. 5. It follows that the point is formed in almost the same position as the separating point P. Furthermore, the data signal line 12 on the upper display screen side (an upper side with respect to the separating point Q) is formed on a flat surface of the gate insulating film 23.

In step 6, the n$^+$ layer 25 at the separating region, where the source electrode 26 and the drain electrode 27 are separated from each other in the TFT 13, is etched and removed. In step 7, the passivation film 28 is formed so as to cover the whole TFT 13 and the data signal line 12. Furthermore, in step 8, a transparent electrode ITO that is to function as the pixel electrode 14 is formed on the passivation film 28 of the TFT 13, and is connected with the drain electrode 27 via the contact hole 29 that is formed in advance by the photolithography process.

With the steps described above, the data signal lines 12 on the upper and lower display screen sides are electrically isolated from each other at the separating point Q while both the n$^+$ layer 25 and the i-layer 24 have been etched and removed.

Moreover, after being completed by subsequent steps, the TFT substrate is combined with a counter electrode substrate (a color filter substrate), and liquid crystal is injected between the substrates. Thus, a display panel is assembled. The display panel can be a display panel in which (i) amorphous silicon is used as pixels and (ii) the respective drivers, as illustrated in FIG. 3, which are prepared in a form of IC(s) are mounted on the display panel. Alternatively, the display panel can be a display panel in which the respective drivers, as illustrated in FIG. 3, and the pixels are integrally formed by use of polycrystalline silicon or CG silicon.

As described above, according to the present embodiment, each of the data signal lines 12 is separated, at a point where neither i-layer 24 of the TFT 13 nor n$^+$ layer 25 of the TFT 13 is formed, so as to be separated between adjacent divided display screens into which a display screen is divided along the data signal lines 12. This causes no i-layer 24 to exist at the separating point Q where the data signal line 12 is separated between the adjacent divided display screens, that is, between the data signal lines 12 on the upper and lower display screen sides. Accordingly, even when static electricity is accumulated on the data signal line 12 in the process of manufacturing the TFT substrate, the i-layer 24 cannot be broken down due to the discharge generated at the separating point Q where the data signal line 12 bridging the adjacent divided display screens is separated.

Thus, it becomes possible to realize a TFT substrate in which ESD hardly occurs in a separating point of a data signal line.

Further, the i-layer 24 and the n$^+$ layer 25 are stacked in sequence, on the gate insulating film 23. As such, when a data signal line 12 is separated on an upper surface of the gate insulating film 23 that is used in formation of the TFT 13, the upper surface of the gate insulating film 23 is exposed after the i-layer 24 and the n$^+$ layer 25 are removed during the separation. The upper surface thus exposed allows separated data signal lines 12 to be electrically isolated.

In the embodiment, the separating point Q is formed in almost the same position as the conventional separating point P. The present embodiment, however, is not limited to this. Namely, the separating point Q can be formed in any regions, provided that the separating point Q is formed in a region, where neither i-layer 24 nor n$^+$ layer 25 is formed, such as a region on the upper screen side with respect to an end of the conventional i-layer 24 and n$^+$ layer 25 on the B' side. At this point, when the separating point Q is formed on a flat surface as in the embodiment, it is possible to easily and surely pattern the separating point Q and the data signal line 12 at the separating point Q. Furthermore, in the embodiment, the separating point Q is positioned relatively with respect to the scan signal line 11 that also functions as the storage capacitor line. The present invention, however, is not limited to this. In a case where the storage capacitor line 30 is formed separately from the scan signal line 11 (see a dashed two-dotted line in FIG. 2), the separating point Q can be positioned relatively with respect to either one of them. Alternatively, the separating point Q can be formed on the scan signal line 11 and/or the storage capacitor line. Further, in the embodiment, the data signal line 12 is separated on the upper surface of the gate insulating film 23. The present embodiment is not limited to this. Specifically, the data signal line 12 can be separated in any region provided that the data signal line 12 is electrically separated between the upper display screen side and the lower display screen side.

Further, the present embodiment deals with a case where the display screen is divided into the upper display screen and the lower display screen. It is, as a matter of course, possible to apply the present invention to a general TFT substrate, on which TFTs, scan signal lines, and data signal lines are formed, for use in a liquid crystal display panel in which (i) a display screen is divided into a plurality of display screens so that the divided display screens are arrayed in a direction of the data signal line and (ii) the display screens thus divided are driven by scan signal line drive circuits and data signal line drive circuits, respectively.

Furthermore, the TFT substrate, the display panel and the display device may not employ liquid crystal. For example, it is possible to use an organic EL element, dielectric liquid, or an electrochromic material, as a display element, instead of the liquid crystal.

Moreover, in the TFT substrate of the present invention, the separation can be carried out on the upper surface of the gate insulating film used in formation of the TFT.

According to the present invention, an intrinsic semiconductor layer and a layer used as source and drain regions of a TFT are stacked, in sequence, on a gate insulating film. As such, when a data signal line is separated on an upper surface of the gate insulating film that is used in formation of the TFT, the upper surface of the gate insulating film is exposed after the intrinsic semiconductor layer and the layer used as the source and drain regions of the TFT are removed during the separation. The upper surface thus exposed allows the separated data signal lines to be electrically isolated.

Further, in the TFT substrate of the present invention, neither the intrinsic semiconductor layer nor the layer used as the source and drain regions of the TFT is formed below edge parts of two of data signal lines that face each other via a point where the data signal lines are separated, and the edge parts are directly formed on a base on which the intrinsic semiconductor layer is formed elsewhere.

With the arrangement, as illustrated in cross-sectional views of the steps 5 through 8 of FIG. 1, neither the intrinsic semiconductor layer, nor the layer used as the source and drain regions of the TFT is formed not only below the separating point but also below the edge parts of two data signal lines that face each other via the separating point. The edge parts of the two data signal lines are formed directly on the base on which the intrinsic semiconductor layer is formed elsewhere. Accordingly, it is possible to remove, more widely than a region of the separating point, (i) the intrinsic semiconductor layer and (ii) the layer used as source and drain regions of the TFT, before the data signal line is formed. As a result, the inadequate removing hardly occurs in a removing step required for the separation, and it becomes easy to prevent an insulation failure in the separating point where the two data signal lines, which are formed in a subsequent step, are separated.

Further, in the TFT substrate of the present invention, the data signal lines may not be separated in a region above lines which intersect with the data signal lines so as to be below the data signal lines.

With the arrangement, the data signal lines are not separated in a region above lines which intersect with the data signal lines so as to be below the data signal lines. As such, it is possible to carry out a step for forming the separating point with respect to a wide flat region. Accordingly, it is possible to easily prevent a failure in the step for forming the separating point.

Further, a display panel of the present invention may include the TFT substrate.

With the arrangement, it becomes possible to realize a display panel in which ESD hardly occurs in a separating point of a data signal line.

Furthermore, a display device of the present invention may include the display panel.

With the arrangement, it becomes possible to realize the display device in which ESD hardly occurs in the separating point of the data signal line.

Moreover, a method for manufacturing the TFT substrate of the present invention may include the steps of: forming a first region where neither the intrinsic semiconductor layer nor the layer used as source and drain regions of a TFT is formed; and forming the data signal lines on a region including the first region so that the data signal lines are separated in the first region.

With the method, the first region where neither the intrinsic semiconductor layer nor the layer used as source and drain regions of the TFT is formed, and then, the data signal lines formed on the region including the first region so that the data signal lines are separated in the first region (see the steps 4 and 5 of FIG. 1). Accordingly, it is possible to remove, more widely than a region of the separating point, (i) the intrinsic semiconductor layer and (ii) the layer used as the source and drain regions of the TFT, before the data signal line is formed. As a result, the inadequate removing hardly occurs in a removing step required for the separation, and it becomes easy to prevent an insulation failure in the separation point where the two data signal lines, which are formed in a subsequent step, are separated.

Further, the method according to the present invention may include the steps of: forming the intrinsic semiconductor layer and the layer used as the source and drain regions of the TFT on an upper surface of a gate insulating film used in formation of the TFT; and forming a region where neither the intrinsic semiconductor layer nor the layer used as the source and drain regions of the TFT is formed, by etching both of the layers.

With the method, after (i) the intrinsic semiconductor layer and (ii) the layer used as the source and drain regions of the TFT are formed on the upper surface of the gate insulating film used in formation of the TFT (see the steps 3 and 4 of FIG. 1), the etching is carried out with respect to the layers (i) and (ii). This allows the region, where the upper surface of the gate insulating film used in formation of the TFT is exposed, to be formed as the region where neither the intrinsic semiconductor layer nor the layer used as the source region and drain regions of the TFT is formed. Accordingly, it becomes possible for the data signal lines of adjacent divided display screens to be electrically isolated with ease, when the separating point is formed in the region thus formed.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is suitably applicable to a high-definition liquid crystal display device.

The invention claimed is:

1. A TFT substrate, structure, comprising:
TFTs, scan signal lines, and data signal lines formed on a TFT substrate, for use in a display panel in which (i) a display screen is divided into a plurality of display screens so that the divided display screens are arrayed in a direction of the data signal line and (ii) the display screens thus divided are driven by scan signal line drive circuits and data signal line drive circuits, respectively, wherein:
each of the data signal lines is electrically separated, at a point where neither an intrinsic semiconductor layer as a semiconductor layer used in formation of a channel region of the TFT nor a layer formed on the intrinsic semiconductor layer and used as source and drain regions of the TFT is formed, so as to be electrically separated between adjacent ones of the divided display screens into which the display screen is divided along the data signal lines;
in a predetermined region including a region above lines which intersect with the data signal lines so as to below the data signal lines, (i) the intrinsic semiconductor layer is formed, (ii) the layer used as the source and drain regions of the TFT is formed on the intrinsic layer, and (iii) the data signal lines are formed on the layer used as the source and drain regions of the TFT;
neither the intrinsic semiconductor layer nor the layer used as source and drain regions is formed below edge parts of two of data signal lines that face each other via the point where each of the data signal lines is electrically separated; and
the edge parts are formed directly on a base on which the intrinsic semiconductor layer is formed elsewhere.

2. The TFT substrate structure according to claim 1, wherein: said each of the data signal lines is electrically separated on an upper surface of a gate insulating film used in formation of the TFT.

3. The TFT substrate structure according to claim 1, wherein: the data signal lines are not electrically separated in a region above lines which intersect with the data signal lines so as to be below the data signal lines.

4. A display panel comprising a TFT substrate structure according to claim 1.

5. A display device comprising a display panel according to claim 4.

6. A method for manufacturing a TFT substrate on which TFTs, scan signal lines, and data signal lines are formed, for use in a display panel in which (i) a display screen is divided into a plurality of display screens so that the divided display screens are arrayed in a direction of the data signal line and (ii) the display screens thus divided are driven by scan signal line drive circuits and data signal line drive circuits, respectively, wherein:
each of the data signal lines is electrically separated, at a point where neither an intrinsic semiconductor layer as a semiconductor layer used in formation of a channel region of the TFT nor a layer formed on the intrinsic semiconductor layer and used as source and drain regions of the TFT is formed, so as to be electrically separated between adjacent ones of the divided display screens into which the display screen is divided along the data signal lines; the method comprising:
forming the intrinsic semiconductor layer, the layer used as the source and drain regions of the TFT, and the data signal line, in this order;
forming the point where neither the intrinsic semiconductor layer nor the layer used as source and drain regions of a TFT is formed, and then forming each of the data signal lines on a region including the point in such a manner that: (i) the intrinsic semiconductor layer, the layer used as source and drain regions of the TFT, and the data signal lines are formed in this order in a predetermined region including a region above lines which intersect with the data signal lines so as to below the data signal lines, so that each of the data signal lines is separated in the point, (ii) neither the intrinsic semiconductor layer nor the layer used as source and drain regions is formed below edge parts of two of data signal lines that face each other via the point where each of the data signal lines is electrically separated; and (iii) the edge parts are formed directly on a base on which the intrinsic semiconductor layer is formed elsewhere.

7. The method according to claim 6, further comprising the steps of: forming the intrinsic semiconductor layer and the layer used as the source and drain regions of the TFT on an upper surface of a gate insulating film used in formation of the TFT; and forming a region where neither the intrinsic semiconductor layer nor the layer used as the source and drain regions of the TFT is formed, by etching both of the layers.

* * * * *